United States Patent [19]

Glenn

[11] 3,767,975

[45] Oct. 23, 1973

[54] ELECTRICAL SWITCHING DEVICE AND CIRCUIT BOARD THEREFOR

[76] Inventor: Ashley C. Glenn, 2440 Darian Dr., Reading, Ohio 45215

[22] Filed: June 29, 1972

[21] Appl. No.: 267,383

Related U.S. Application Data

[62] Division of Ser. No. 182,454, Sept. 21, 1971, Pat. No. 3,689,715.

[52] U.S. Cl. .......................... 317/101 CE, 174/68.5
[51] Int. Cl. .......................... H05k 1/04
[58] Field of Search .............. 317/101 CE, 101 CM; 200/166 PO; 174/68.5

[56] References Cited

UNITED STATES PATENTS

| | | | |
|---|---|---|---|
| 3,223,216 | 12/1965 | Rub | 317/101 CE |
| 3,356,786 | 12/1967 | Helms | 174/68.5 |
| 2,889,532 | 6/1959 | Slack | 317/101 CE |
| 3,321,600 | 5/1967 | Bernutz | 200/166 PO |

*Primary Examiner*—David Smith, Jr.
*Attorney*—James W. Pearce et al.

[57] ABSTRACT

A switching device which includes a housing in which a plurality of circuit boards are mounted for transverse movement into and out of operative position. A circuit board actuator is mounted in the housing and movable therealong to positions at which it is engageable with selected ones of the circuit boards for moving the circuit boards. Each circuit board has contacts which are engageable with contacts in the housing and means interconnecting selected circuit board contacts. Each circuit board includes a plate-like body with spaced conductive strips on both faces thereof terminating at a contact edge thereof.

4 Claims, 23 Drawing Figures

3,767,975

ELECTRICAL SWITCHING DEVICE AND CIRCUIT BOARD THEREFOR

This is a division of my copending application Ser. No. 182,454, filed Sept. 21, 1971 now U.S. Pat. No. 3,689,715.

This invention relates to electrical switching devices. More particularly, this invention relates to a switching device for an electric or electronic organ or the like.

An object of this invention is to provide a switching device which permits a number of different interconnections between sets of connectors.

A further object of this invention is to provide such a switching device in which any one of a plurality of circuit boards can be selected and put into operative position by operation of a single control handle.

A further object of this invention is to provide an improved, easily constructed circuit board for such a switching device.

Briefly, this invention provides a switching device which includes a housing in which a plurality of circuit boards are mounted for movement into and out of operative position. A circuit board actuator is mounted in the housing and movable therealong to positions at which it is engageable with selected ones of the circuit boards for moving the circuit boards. Each circuit board has contacts which are engageable with contacts in the housing and means interconnecting selected circuit board contacts. Each circuit board includes a plate-like body with spaced conductive strips on both faces thereof terminating at a contact edge thereof. A perforated flexible sheet overlies one face of the body. Conductive strips on the sheet extend transversely of the strips on the underlying face of the body. The conductive strips on the other side of the board are angle shaped and are connected to strips on the sheet. Selected strips on the sheet are connected to selected strips on the underlying face by pins which extend through the sheet. The circuit board can be moved into an operative position in which spring contacts in the device engage the strips at the contact edge.

The above and other objects and features of the invention will be apparent to those skilled in the art to which this invention pertains from the following detailed description and the drawings, in which.

In the following detailed description and the drawings, like reference characters indicate like parts.

Figures 1, 2, 3:
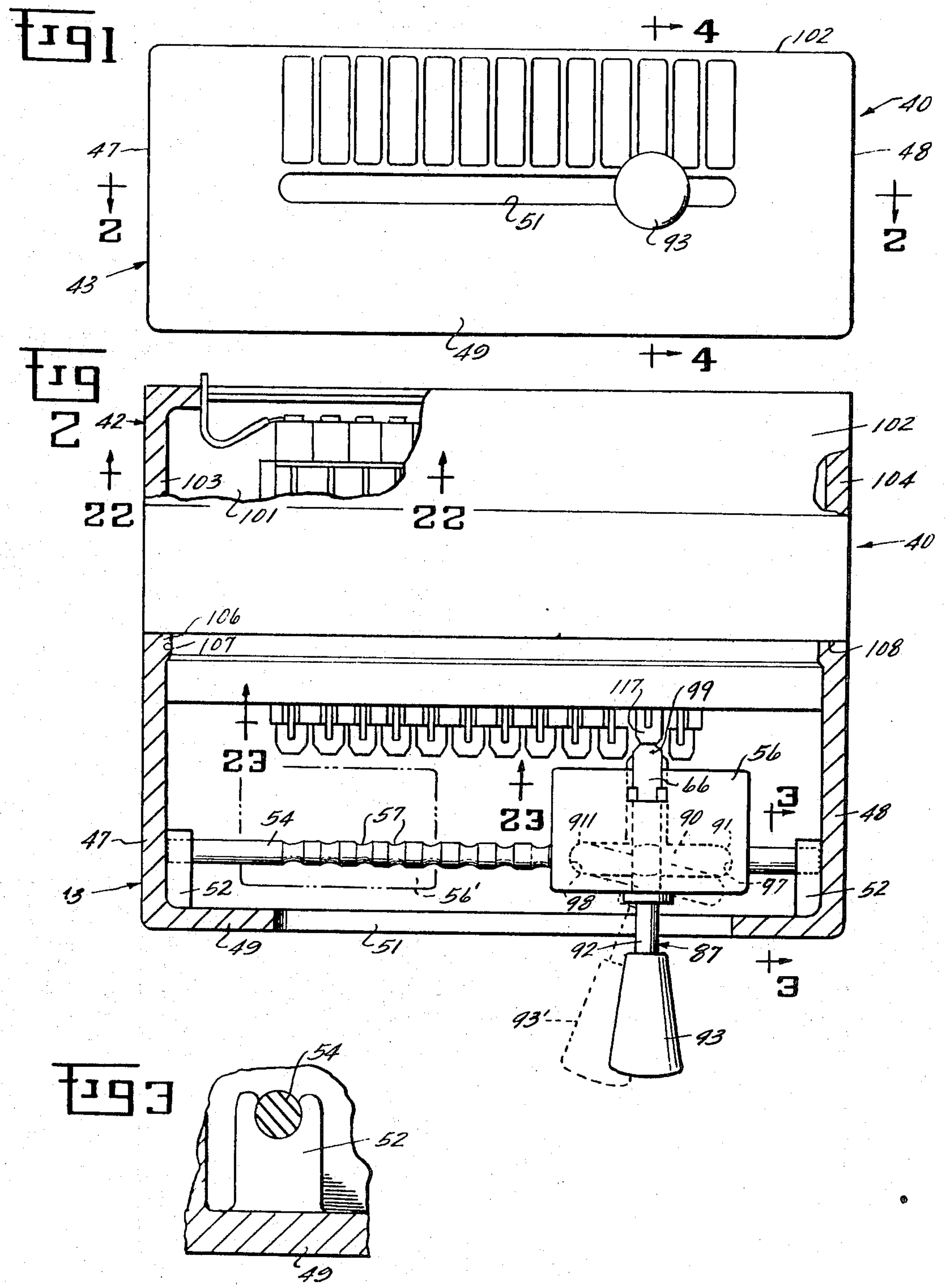
FIG. 1 is a view in side elevation of a switching device constructed in accordance with an embodiment of this invention.
FIG. 2 is a somewhat schematic view in section taken on the line 2—2 in FIG. 1.
FIG. 3 is a view in section taken on the line 3—3 in FIG. 2.

In FIGS. 1 and 2 is shown a switching device 40 constructed in accordance with an embodiment of this invention. The device includes a hollow generally tubular first main housing portion 42 (FIGS. 2 and 4) and a generally cup-shaped second main housing portion 43. The cup-shaped main housing portion 43 includes side walls 44 and 46 (FIG. 4), end walls 47 and 48 (FIG. 2) and an outer or bottom wall 49 provided with a lengthwise slot 51. Lugs 52 mounted in the cup-shaped main housing portion 43 support guide rods 53 and 54 which are mounted inside the cup-shaped main housing portion 43 spaced on opposite sides of and parallel to the slot 51. As shown in FIG. 3, each of the lugs 52 is bifurcated so that the guide rods can be snapped into position in the lugs, the material of the lugs and of the housing portions being resilient so that the guide rods are firmly held by the lugs. The guide rods support a sliding actuator housing 56 which can move along the guide rods as between the full line position of FIG. 2 and the dot-dash line position shown at 56'. The guide rod 54 is provided with circumferential grooves 57 for receiving a spring pressed ball detent 58 (FIG. 4) which is mounted in a bore 59 in the sliding actuator housing 56. The detent causes the sliding actuator housing to stop at selected positions along the guide rods 53 and 54.

Figure 20:
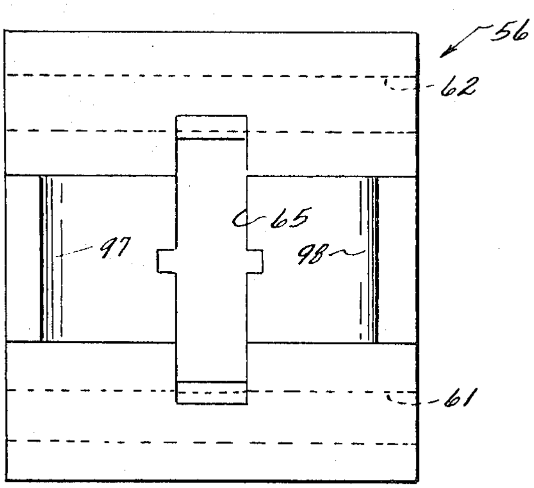
FIG. 20 is a view in end elevation of the sliding actuator housing shown in FIG. 15.

The guide rods 53 and 54 are received inside parallel guide bores 61 and 62, respectively, in the sliding actuator housing 56. The bore 62 intersects the detent bore 59 so that the detent 58 can engage the guide rod 54. A compression spring 63 mounted in the detent bore 59 is held in engagement with the detent ball 58 by a plug 64 threaded in the detent bore 59. A sliding actuator 66 is slidably mounted inside the actuator housing 56 in an opening 65 (FIGS. 19 and 20) therein for sliding crosswise of the guide bores 61 and 62 between the full line position shown in FIG. 19 and a retracted position shown at 66'. A leaf spring 69 urges the sliding actuator 66 to the full line position of FIG. 19.

Figures 13, 14, 15, 16, 17, 18, 19:
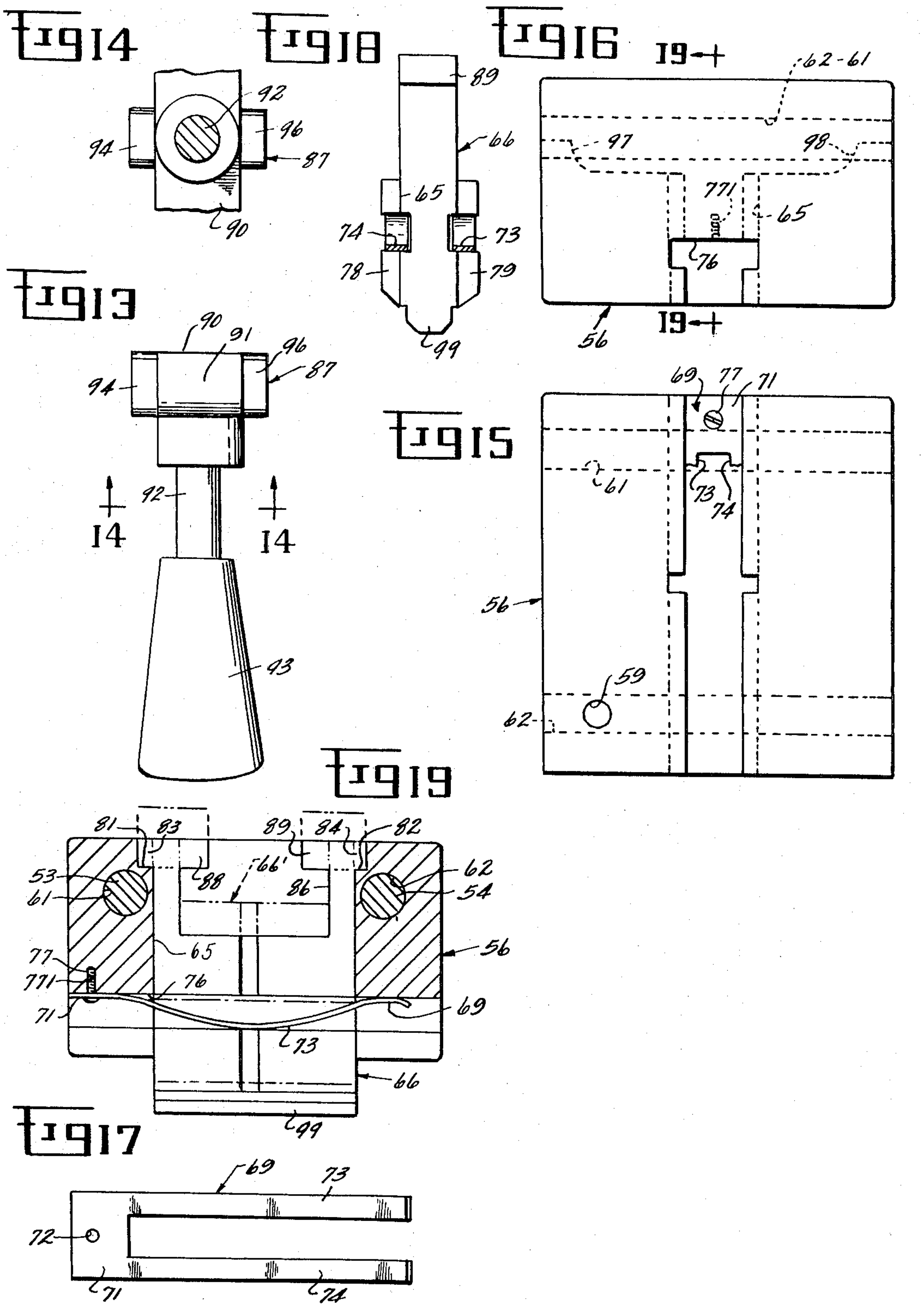
FIG. 13 is a view in side elevation of the actuating handle member shown in FIGS. 11 and 12.
FIG. 14 is a view in section taken on the line 14—14 in FIG. 13.
FIG. 15 is a view in end elevation of a sliding actuator housing forming a part of the device shown in FIG. 1, a fragmentary portion of a spring being shown in association therewith.
FIG. 16 is a top plan view of the sliding actuator housing shown in FIG. 15.
FIG. 17 is a plan view of the spring of which a fragmentary portion is shown in FIG. 15.
FIG. 18 is an end elevational view of an actuator slide member forming a part of the device shown in FIG. 1, a fragmentary portion of the spring of FIG. 17 being shown in association therewith.
FIG. 19 is a view in section of the sliding actuator housing taken on the line 19—19 in FIG. 16, the sliding actuator and the spring of FIG. 17 being shown in association therewith.

As shown in FIG. 17, the spring 69 includes a central portion 71 having a perforation 72 and spring arms 73 and 74. The central portion 71 is held flatwise against a shoulder 76 (FIG. 19) of the actuator housing 56 by a screw fastener 77 which is mounted in a bore 771 in the actuator housing 56 with the arms 73 and 74 extending on opposite sides of the sliding actuator 66 as shown in FIG. 18 and engaging sidewise projections 78 and 79 of the sliding actuator 66. Stop shoulders 81 and 82 (FIG. 19) in the actuator housing 56 engage stop flanges 83 and 84 of the sliding actuator 66 to limit movement thereof in spring urged direction. An end portion of the sliding actuator is cut away as indicated at 86 to receive a portion of a handle member 87 (FIGS. 11–14 inclusive). Inwardly extending flanges 88 and 89 (FIG. 19) on the sliding actuator 66 overlie the cut away portion 86.

Figures 4, 5, 6, 7:
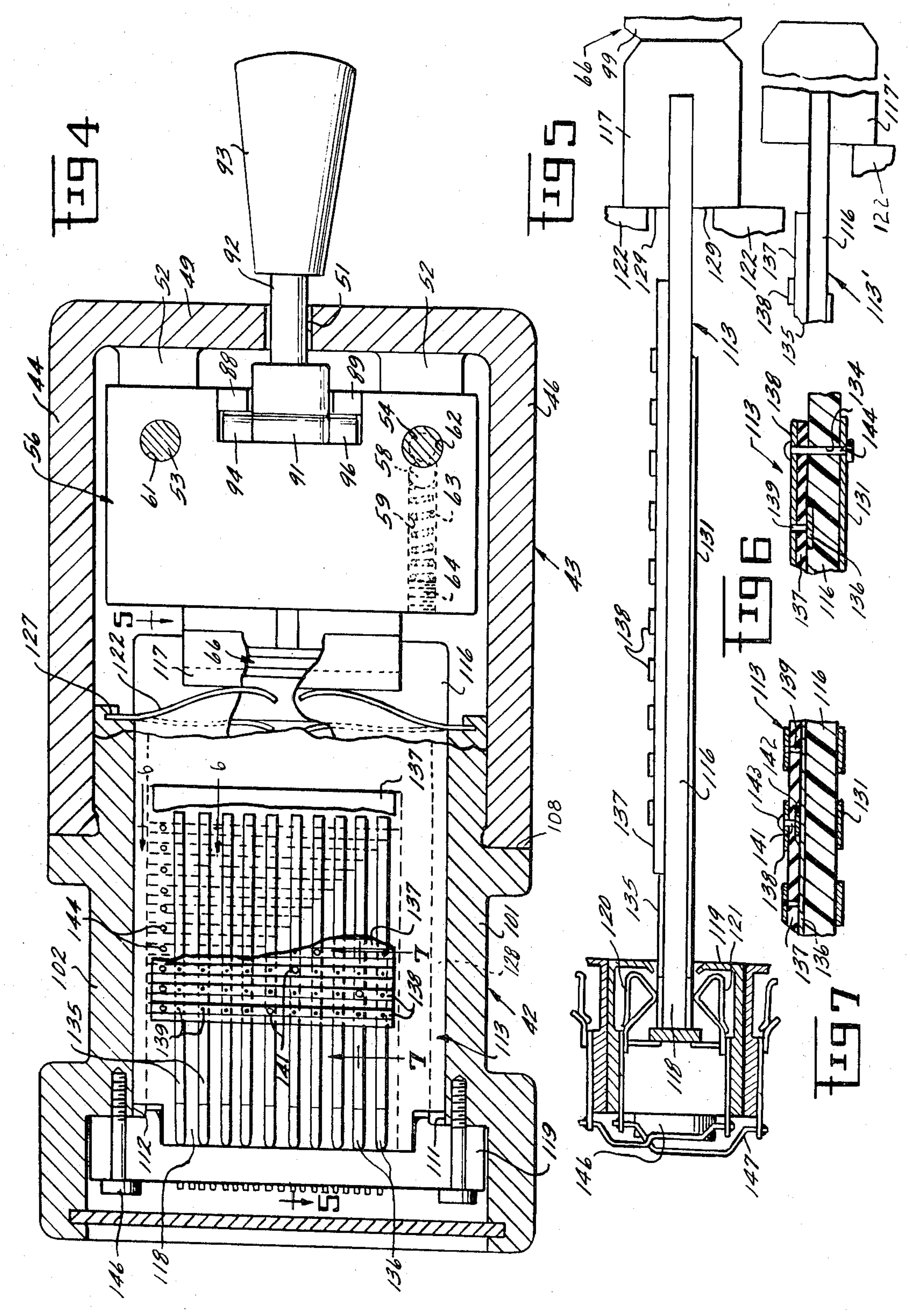
FIG. 4 is a view in section taken generally on the line 4—4 in FIG. 1, a portion of an outer face layer of a circuit board thereof and a portion of another circuit board being broken away for clarity of disclosure.
FIG. 5 is a fragmentary view in section taken on an enlarged scale on the line 5—5 in FIG. 4.
FIG. 6 is a view in section taken on an enlarged scale on the line 6—6 in FIG. 4.
FIG. 7 is a view in section taken on an enlarged scale on the line 7—7 in FIG. 4.

The handle member 87 (FIGS. 11–14) includes an elongated body 90 (FIG. 11) having rounded ends or journal portions 91 and 911. A handle shaft 92 extends normally to the body 90 at the center thereof. A hand grip 93 is carried at an outer end of the shaft 92. Lugs 94 and 96 extend outwardly of the body at the center thereof in opposite directions normally to the handle shaft 92 and to the body 90. The handle member 87 is mounted in the actuator housing as shown in FIG. 4 with the rounded end portions 91 and 911 of the body 90 in position for engaging quarter cylinder shaped bearing faces or seats 97 and 98 (FIG. 16) respectively in the actuator housing and the lugs 94 and 96 underlying the flanges 88 and 89 respectively (FIG. 4) of the sliding actuator 66. When the hand grip portion 93 of the handle member is swung from the full line position of FIG. 2 to the dashed line position indicated at 93', the body 90 swings as shown and the sliding actuator is retracted from the full line position of FIG. 19 to the dot-dash line position indicated at 66'. Further pushing of the hand grip portion 93 (FIG. 2) in the same direction causes the actuator housing 56 to move along the guide rods to another position. When the hand grip portion 93 of the handle member 87 is released, it returns to the advanced full line position of FIG. 2, and the sliding actuator 66 is advanced to the full line position of FIGS. 2 and 19 in which a head end 99 of the sliding actuator 66 projects outwardly of the actuator housing 56.

The cup-shaped main housing portion 43 is mounted on the tubular main housing portion 42 with side and end walls of the cup-shaped main housing portion 43 surrounding side walls 101 and 102 and end walls 103 and 104 of the tubular main housing portion and edge flanges 106 on the walls of the cup-shaped main housing portion 43 received in grooves 107 in the walls of the tublar housing 42 to lock the main housing portions in assembled relation with end edges of the walls of the cup-shaped housing portion engaging shoulders 108 on the tubular housing portion.

Figure 22:
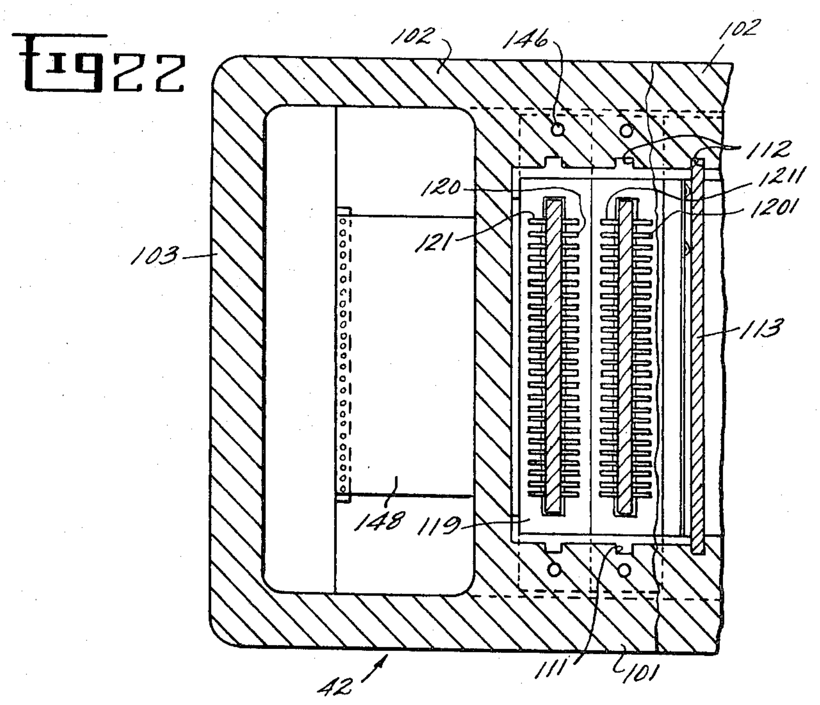
FIG. 22 is a view in section taken on the line 22-22 in FIG. 2.
Figure 23:
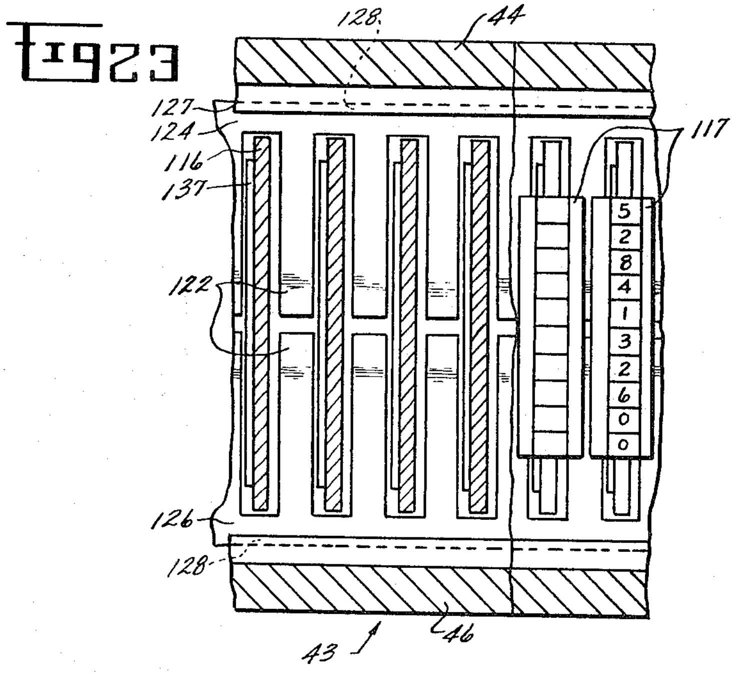
FIG. 23 is a view in section taken on the line 23-23 in FIG. 2.

The side walls 101 and 102 of the tubular main housing portion 43 are provided with track slots 111 and 112, respectively, as shown in FIG. 22. Edges of circuit boards 113 are slidably received in the track slots 111 and 112. As shown in FIGS. 4 and 5, each circuit board 113 includes a plate-like body portion 116 and a head 117. The head 117 is engageable by the head 99 of the sliding actuator 66, as shown in FIG. 5, to move the circuit board in a direction to advance a contact end portion 118 thereof into a contact box 119 between rows of spring contacts 120 and 121 in the contact box 119. Spring leaves 122 urge the circuit boards to normally retracted positions at which a head 117' of a circuit board 113' is shown in FIG. 5. The spring leaves 122 are portions of spring members 124 and 126 (FIG. 23). Each of the spring members 124 and 126 includes a base portion 127, which is received in a slot 128 (FIG. 4) of a wall of the tubular housing portion 42, and a plurality of leaves 122 which underlie shoulders 129 (FIG. 5) of the heads 117 of the circuit boards 113. The strength of the spring leaves engaging each circuit board head is sufficient to retract the circuit board when released. However, the strength of the spring 69 which urges the sliding actuator 66 is sufficient to overcome the spring leaves 122, which urge the circuit board to withdrawn or retracted position. When the sliding actuator 66 is retracted, by movement of the handle member 87, further movement of the handle member in the same direction advances the actuator housing to bring the sliding actuator to a position opposed to another circuit board 113, and, when the handle member 87 is released, the sliding actuator 66 is advanced to advance the other circuit board to advanced position. The slots on the guide rod 54 are so arranged that the detent ball 58 is arranged to hold the actuator housing in positions in which the sliding actuator 66 is opposed to one of the circuit boards 113.

Figures 8, 9, 10, 11, 12:
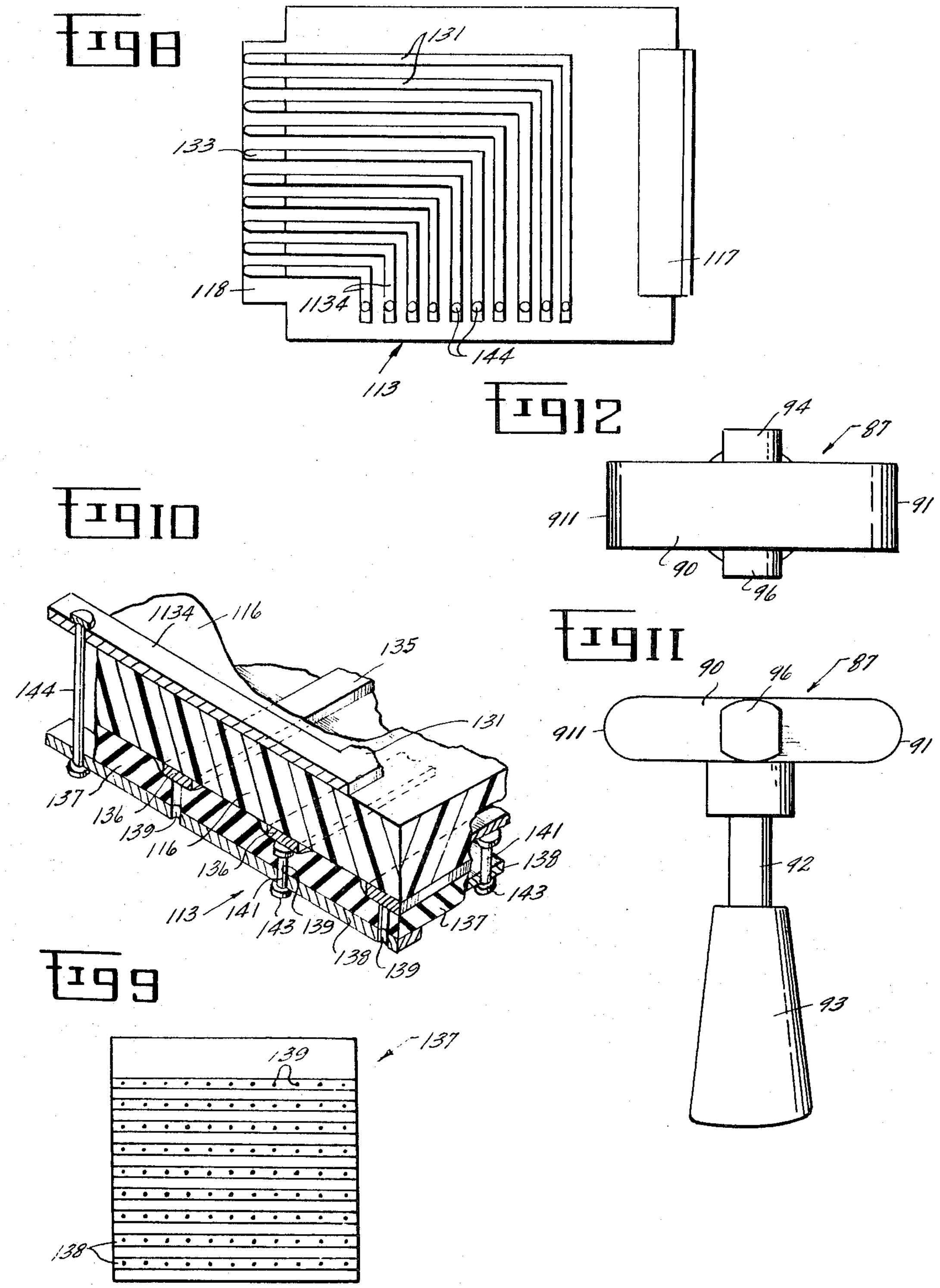
FIG. 8 is a side elevational view of one of the circuit boards of the device shown in FIG. 1.
FIG. 9 is a plan view of an outer face layer of a circuit board removed therefrom.
FIG. 10 is a fragmentary sectional perspective view showing details of construction of the circuit board shown in FIG. 8.
FIG. 11 is a top plan view of an actuating handle member forming a part of the device shown in FIG. 1.
FIG. 12 is a view in end elevation of the actuating handle member shown in FIG. 11.

Details of construction of one of the circuit boards 113 are shown in FIGS. 4–10, inclusive. The plate-like body portion 116 can be formed of appropriate dielectric material. On one face thereof are provided spaced angle-shaped strips of electrically conductive material 131, as shown in FIG. 8. Each strip 131 terminates at one end at the contact end portion 118 of the circuit board 113 in a portion 133 having an exposed face of abrasive resistant non-corroding metal capable of forming a sliding connection with one of the spring contacts, such as palladium. At the opposite end, each strip 131 terminates adjacent a perforation 134 (FIG. 6) which extends through the body portion 116 and through the strip 131 at a side arm portion 1134 (FIG. 8) of the strip. On the opposite face of the body 116 are spaced elongated parallel strips of conductive material 135 (FIG. 4) which terminate at the contact end portion 118 in face portions 136 of abrasive resistant non-corroding metal such as palladium. A sheet 137 of flexible dielectric material (FIG. 9) is provided with parallel strips 138 of conductive material which are spaced the same distance as side arm portions 1134 of the angle-shaped conductive strips 131. Spaced perforations 139 (FIG. 10) are formed in the flexible sheet 137 and in the conductive strips 138. The spacing between perforations is the same as the spacing between the elongated conductive strips 136.

In the assembly of the circuit board 113, pins 141 (FIGS. 4, 6, and 10) are mounted in selected perforations of the flexible sheet 137, and the flexible sheet is mounted on the body of the circuit board as shown in FIG. 4. The flexible sheet 137 can be provided with a coating of pressure sensitive adhesive for attaching to the body portion 116. The flexible sheet 137 is positioned with a head 142 of each of the pins 141 engaging a selected conductive strip 136. A second head 143 on each of the pins 141 engages one of the strips 138. Elongated pins 144 (FIGS. 6 and 10), which extend through the perforations 134 in the body portion 116, form connections between each of the angle-shaped conductive strips 131 and one of the conductive strips 138 of the flexible strip. Thus, the positioning of the pins 141 provides the interconnections between selected angle-shaped conductive strips 131 and selected elongated conductive strips 136.

One contact box 119 is provided for each circuit board 113. Each contact box 119 is held in place in the tubular main housing portion 42 opposite the associated circuit board by appropriate fasteners 146 (FIG. 4). Each contact box contains a plurality or bank of spring contacts 120 and 121, there being at least one spring contact 120 on one side of the circuit board 113 for each conductive strip 135 and at least one spring contact 121 on the opposite side of the contact board for each angle-shaped abrasive strip 131. The contacts of adjacent contact boxes are connected together by appropriate leads 147 as shown in FIG. 5. Preferably, spring contacts which are aligned along the main housing portions are connected together. Thus the contact 121 (FIG. 22) is preferably connected to a contact 1211 and the contact 120 preferably is connected to a contact 1201. The contacts are also connected to conductors in a cable 148 which extends out of the housings. On each circuit board, the conductive strips 135 on one side of the body 113 are offset from the portions of the angle-shaped conductive strips 131 on the opposite side at the contact end portion 118 so that the contact end portion of one of the conductive strips 131 on one side of the circuit board is aligned with the contact 121 and the contact end portion of one of the conductive strips 135 on the other side of the board is aligned with the contact 120.

Figure 21:
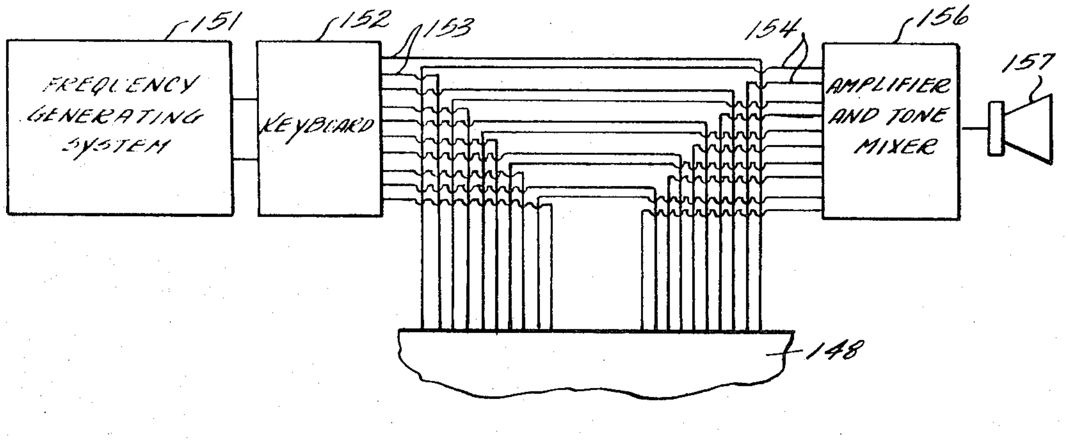
FIG. 21 is a schematic wiring diagram showing the device associated with related parts of an electronic organ.

In FIG. 21 is shown a schematic circuit diagram for an electronic organ including my switching device. In the type of electronic organ shown, a frequency generating system 151 supplies signals to a keyboard 152. Operation of keys of the keyboard (not shown in detail) feeds selected signals to conductors 153. The conductors 153 are connected through the input cable 148 to the contacts 120 on one side of each circuit board. The contacts 121 are connected through the cable 148 to conductors 154 which feed into an amplifying and mixing device 156 which delivers a final output signal to a speaker 157. The switching device makes it possible to connect any one of the conductors 153 with any one of the conductors 154 to properly mix the signals of the conductors 153 and control the nature and quality of the sound emitted by the speaker 157.

In the use of the device, appropriate circuit boards are selected to provide the mixing required for a particular piece or pieces of music and are mounted in the track slots 111 and 112 of the main housing portion 42 (FIG. 4). The circuit boards can be arranged in the order in which they will be required in the playing of the music. Then, as the music is played and circuit boards are to be changed, the musician can swing the handle member 87 to cause release of a first circuit board and can then advance the actuator housing to opposite a selected circuit board, releasing the handle to permit the sliding actuator 66 to engage the selected circuit board to drive it into operative position to properly select the mix of the signals.

The switching device replaces a large number of draw bars or the like which ordinarily are required to mix the signals and requires operation of only a single handle instead of a large number of handles.

The switching device illustrated in the drawings and described above is subject to structural modification without departing from the spirit and scope of the invention.

Having described my invention, what I claim and desire to secure by Letters Patent is:

1. A circuit board for a switching device which comprises a plate-like body, spaced strips of conductive material on each face of the body, the strips terminating in contact portions at a contact edge of the body, the strips on one face of the body being parallel, each of the strips on the other face of the body being angle shaped and including a first section parallel to the strips on the first face and second section extending to one side of the strips on the first face, a sheet of dielectric material overlying the conductive strips on the first face of the body, spaced conductive strips on the sheet extending transversely of the conductive strips on the body face underlying the sheet, each of the strips on the sheet overlying all of the strips on the first face and having a section over-lying the sidewise extending section of one of the angle shaped strips on the other face of the body, means connecting each of the conductive strips on the other face of the body with one of the conductive strips of the sheet at the overlying sections thereof, and means connecting selected conductive strips on the sheet with selected conductive strips on the underlying face at the overlying sections thereof, whereby selected conductive strips on one face of the body are connected to selected conductive strips on the other face of the body.

2. A circuit board as in claim 1 wherein the sheet is provided with perforations extending through the conductive strips of the sheet and opposite the conductive strips on the underlying face of the body, and pins in selected perforations form the connections between conductive strips of the sheet and of the underlying face of the body.

3. A circuit board as in claim 1 wherein a head is provided at an edge of the body opposed to the contact edge for engagement by board actuating means and that shoulder means is provided on the head engageable by the board retracting means.

4. A circuit board as in claim 1 wherein exposed faces of end portions of the conductive strips adjacent the contact edge are formed of palladium.

* * * * *